(12) United States Patent
Chiu et al.

(10) Patent No.: US 10,108,073 B2
(45) Date of Patent: Oct. 23, 2018

(54) HEAT TRANSFER FROM IMAGE SENSOR

(71) Applicant: Google LLC, Mountain View, CA (US)

(72) Inventors: Jerry Chiu, Pacifica, CA (US);
Katherine Stoy, Mountain View, CA (US); Li-Ping Wang, Fremont, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/487,136

(22) Filed: Apr. 13, 2017

(65) Prior Publication Data

US 2018/0259831 A1  Sep. 13, 2018

Related U.S. Application Data

(60) Provisional application No. 62/470,047, filed on Mar. 10, 2017.

(51) Int. Cl.
*G03B 17/55* (2006.01)
*H04N 5/247* (2006.01)
*H01L 27/146* (2006.01)
*H04N 5/225* (2006.01)

(52) U.S. Cl.
CPC ........ *G03B 17/55* (2013.01); *H01L 27/14627* (2013.01); *H04N 5/2254* (2013.01); *H04N 5/247* (2013.01)

(58) Field of Classification Search
CPC .......... H04N 5/2254; G03B 17/55; G06F 1/20
See application file for complete search history.

(56) References Cited

U.S. PATENT DOCUMENTS

| 5,981,933 | A | 11/1999 | Chamberlain et al. |
| 9,179,053 | B2 | 11/2015 | Takeshita et al. |
| 9,204,025 | B1 | 12/2015 | Tam |
| 2005/0195503 | A1* | 9/2005 | Chen ..................... G02B 1/115 359/819 |
| 2008/0198556 | A1* | 8/2008 | Iwata ................ H01L 27/14618 361/717 |
| 2013/0077257 | A1 | 3/2013 | Tsai |

(Continued)

FOREIGN PATENT DOCUMENTS

| JP | H02-308559 | 12/1990 |
| KR | 2012-0021083 | 3/2012 |

(Continued)

OTHER PUBLICATIONS

"Nikon Patent Solves Camera Overheating by Integrating Removable Heat Storage", PetaPixel, https://petapixel.com/2013/07/06/nikon-patent-solves-camera-overheating-by-integrating-removable-heat-storage/, Jul. 6, 2013, 9 pages.

(Continued)

*Primary Examiner* — Ahmed A Berhan
(74) *Attorney, Agent, or Firm* — Fish & Richardson P.C.

(57) ABSTRACT

A heat transfer apparatus includes a circuit board assembly and an image sensor including a plurality of photodetectors disposed in a semiconductor material. The image sensor is mounted to the circuit board assembly. A thermal strap with a first end is thermally coupled to transfer heat out of the image sensor. A heat sink is thermally coupled to a second end of the thermal strap opposite the first end of the thermal strap to receive heat from the image sensor.

15 Claims, 4 Drawing Sheets

(56) References Cited

U.S. PATENT DOCUMENTS

| | | | |
|---|---|---|---|
| 2014/0055670 A1* | 2/2014 | Hongo | H04N 5/2253 348/374 |
| 2014/0168507 A1 | 6/2014 | Renaud | |
| 2014/0264698 A1* | 9/2014 | Huang | H01L 31/024 257/433 |
| 2015/0049243 A1 | 2/2015 | Samuels et al. | |
| 2015/0312456 A1* | 10/2015 | Bauer | H04N 5/2251 348/374 |
| 2016/0043017 A1 | 2/2016 | Jones et al. | |

FOREIGN PATENT DOCUMENTS

| | | |
|---|---|---|
| WO | WO 2012/015965 | 2/2012 |
| WO | WO 2013/028616 | 2/2013 |

OTHER PUBLICATIONS

International Search Report and Written Opinion issued in International Application No. PCT/US2017/057835, dated Feb. 6, 2018, 18 pages.

\* cited by examiner

HEAT TRANSFER FROM IMAGE SENSOR

CROSS-REFERENCE TO RELATED APPLICATIONS

This application claims the benefit of U.S. Provisional Application No. 62/470,047 filed on Mar. 10, 2017, the contents of which are incorporated herein by reference.

TECHNICAL FIELD

This disclosure relates generally to image sensors and in particular, but not exclusively, relates to thermal management.

BACKGROUND INFORMATION

Image sensors are used in many modern electronic devices including phones, cars, computers, gaming systems, etc. In many of these systems capturing undistorted, in-focus images is critically important. For instance, in cars, image distortion or loss of focus could cause problems viewing the road (e.g., when backing up). In gaming applications, knowing the accurate location of a user is critical, and a distorted image that causes the user's location to be recorded inaccurately could materially change the outcome of a game.

High-performance image sensors produce a lot of heat. This heat could be absorbed by components surrounding the image sensor. The surrounding components may expand as a result of the increased heat. These expansions may shift the position of the image sensor. Moreover, image sensors are often precisely aligned with other optical components, so small shifts in image sensor location due to thermal transfer may shift the positions of those optical components relative to the image sensor. This movement may cause the image to become distorted or out of focus.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Figure 1B:
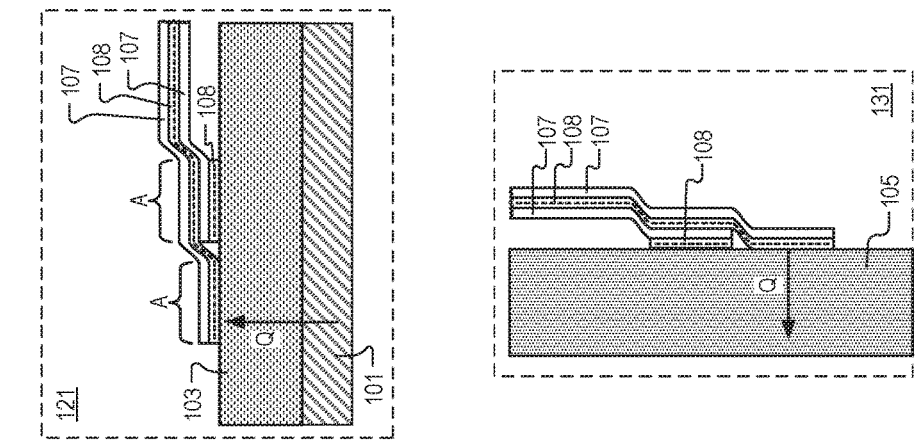
FIG. 1B illustrates a cross section of a heat transfer apparatus, in accordance with an embodiment of the disclosure.

Embodiments of an apparatus and method for heat transfer from an image sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

This disclosure provides systems and methods for heat removal from image sensors. High-performance imaging sensors produce a lot of heat. Precise alignment is required between the optical train (series of lenses) and the image sensor. Commonly this alignment is performed using a process called active alignment, whereby the output of the sensor is used to measure image quality and adjustments are made to bring the optical train into alignment with the sensor. This method overcomes tolerance stack and manufacturing variability that would degrade the quality and performance of the image sensor by adjusting the image back into focus (via changing the distance between the focal point of the optical train and the sensor, known as piston), minimizing distortion (through adjustments to tip and tilt), and aligning the image on the sensor with mounting points or other positional references (by adjusting X-Y position and rotation). These adjustments are often performed by three spring-loaded screws and the imaging sensor is often mounted to the lens barrel via a kinematic mount. Once the adjustments are complete, the adjusted screws are usually staked (e.g. with epoxy) or otherwise prevented from moving. Typically the lens barrel is mounted to the camera's main structure and the sensor is positioned relative to the lens barrel using the kinematic mount. The desired heat transfer path usually ends at the camera's main structure— even when it does not, the thermal mass of the lens barrel is a desirable target for heat dissipation. Once the alignment is established, it is not desirable for mechanical stresses (e.g. shock, vibration) or thermal stresses (e.g. differential coefficient of thermal expansion) to be shared across the active alignment plane. Thus this disclosure provides a flexible, thermally conductive connection between the image sensor (or sensor holder) and the lens (or lens holder) that efficiently removes heat from the sensor while preventing thermal and mechanical stresses from influencing the alignment of the optical train relative to the sensor. In addition to advantages described above, the strap can be applied after active alignment. This way the system only has to take into account movement and misalignment that would occur during use of the device, due to thermal or mechanical stresses, and does not need to accommodate the range of motion required for the active alignment process itself.

Figure 1A:
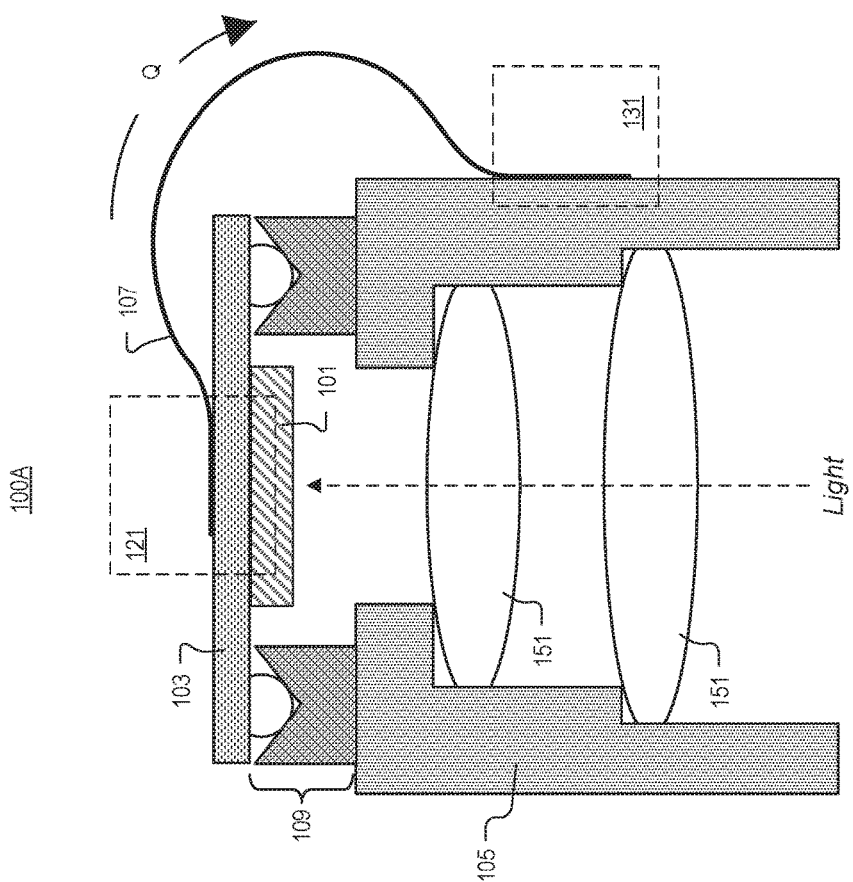
FIG. 1A illustrates a cross section of a camera system, in accordance with an embodiment of the disclosure.

FIG. 1A illustrates a cross section of a camera system 100A, in accordance with an embodiment of the disclosure. Camera system 100A includes image sensor 101, circuit board assembly 103, thermal strap 107 (with first end 121 and second end 131), lens barrel 105, mechanical load path 109 (between circuit board assembly 103 and lens barrel 105), and lens optics 151.

In the depicted embodiment, image sensor 101 includes a plurality of photodetectors contained in a semiconductor material, and image sensor 101 is rigidly mounted to circuit board assembly 103. Thermal strap 107 has a first end 121 thermally and mechanically coupled to circuit board assembly 103, to transfer heat out of circuit board assembly 103 and image sensor 101. Circuit board assembly 103 is interposed between the first end 121 of thermal strap 107 and image sensor 101, and is thermally and mechanically coupled to image sensor 101. The first end 121 of thermal strap 107 receives the heat from circuit board assembly 103. A heat sink (depicted here as lens barrel 105) is thermally and mechanically coupled to the second end 131 of thermal strap 107, opposite the first end 121 of thermal strap 107, to receive heat from image sensor 101. In other words, in the depicted embodiment, heat generated in image sensor 101 is transferred to circuit board assembly 103 and then transferred through thermal strap 107 to a heat sink. Circuit board assembly 103 may be a printed circuit board assembly (PCBA) or the like. In the depicted embodiment, thermal strap 107 is flexible and thus prevents transfer of mechanical stress between image sensor 101/circuit board assembly 103 and the heatsink (e.g., lens barrel 105). Thermal strap 107 transfers heat out of the image sensor 101 and PCBA assembly 103. Removing heat prevents dealignment of image sensor 101 and associated optics, and heat management is also required to comply with operating temperature limits for the electronic components. Circuit board assembly 103 may be a poor conductor of heat resulting in a high heat concentration at the center of the device. Thermal strap may reduce the temperature difference between the center of the image sensor 100 and the rest of camera system 100A. Removal of heat from this area is important. Usually the mechanical load path and the thermal load path are one and the same. This coupling of mechanical load path and thermal load path leads to misalignment when the thermal load through the kinematic mount causes those components to grow. Thermal strap 107 provides a separate, direct, and highly conductive path from image sensor 101 to the heat sink.

As depicted, thermal strap 107 is thermally coupled to the external side of lens barrel 105. However, in other embodiments, thermal strap 107 may be coupled on the internal side of circuit board assembly 103 and the inside portion of lens barrel 105. Moreover, thermal strap 107 may be directly coupled to image sensor 101 to remove heat from image sensor 101. Lens barrel 105 may be coupled to circuit board assembly 103 with mechanical load path 109 (e.g., a kinematic mount and associated tip/tilt/piston and x/y/rotation adjustment mechanics). Although in the depicted embodiment, lens optics 151 includes two lenses, in other embodiments lens optics 151 may include any number of lenses depending on the desired specifications of camera system 100A. As shown, circuit board assembly 103 is located proximate to lens optics 151, and lens optics 151 are located between a source of image light and circuit board assembly 103. Image sensor 101 is mechanically, electrically, and thermally coupled to circuit board assembly 103, and is located between lens optics 151 and circuit board assembly 103 to receive focused image light from lens optics 151.

FIG. 1B illustrates a cross section of a heat transfer apparatus (e.g., thermal strap 107), in accordance with an embodiment of the disclosure. Block 121 shows the first end 121 of thermal strap 107 as depicted in FIG. 1A. In the illustrated example, thermal strap 107 includes a plurality of layers and heat (Q) is transferred out of PCBA 103 and along the length of thermal strap 107. In the depicted embodiment, the individual layers in thermal strap 107 are connected in a stepped pattern with thermal adhesive 108 in a direction away from the surface of circuit board assembly 103, providing equal surface contact area (A) between each layer and the heat sink. This configuration is advantageous when the thermally conductive material is anisotropic—that is, the thermally conductive material is highly conductive along its length but minimally conductive at its surface—such as the case with pyrolytic graphite.

Block 131 shows the second end 131 of thermal strap 107. As illustrated the second end 131 of thermal strap 107 has a similar staircase terracing as first end 121 of thermal strap 107; this staggering of individual layers facilitates heat transfer out of thermal strap 107 into a heat sink (here lens barrel 105) by providing equal surface contact area between each layer and the heat sink. In one embodiment, both the first end 121 and second end 131 of thermal strap 107 are coupled to the circuit board assembly 103 and the heat sink, respectively, with a thermally conductive adhesive 108 (depicted), a mechanical connection (e.g., screwed down to maintain pressure), or the like.

In one embodiment, the plurality of layers in thermal strap 107 includes at least one of copper or aluminum. In another embodiment, the plurality of layers in thermal strap 107 includes graphitic carbon. However, one skilled in the art will appreciate that any number of thermally conductive materials may be used in thermal strap 107.

Figure 1C:
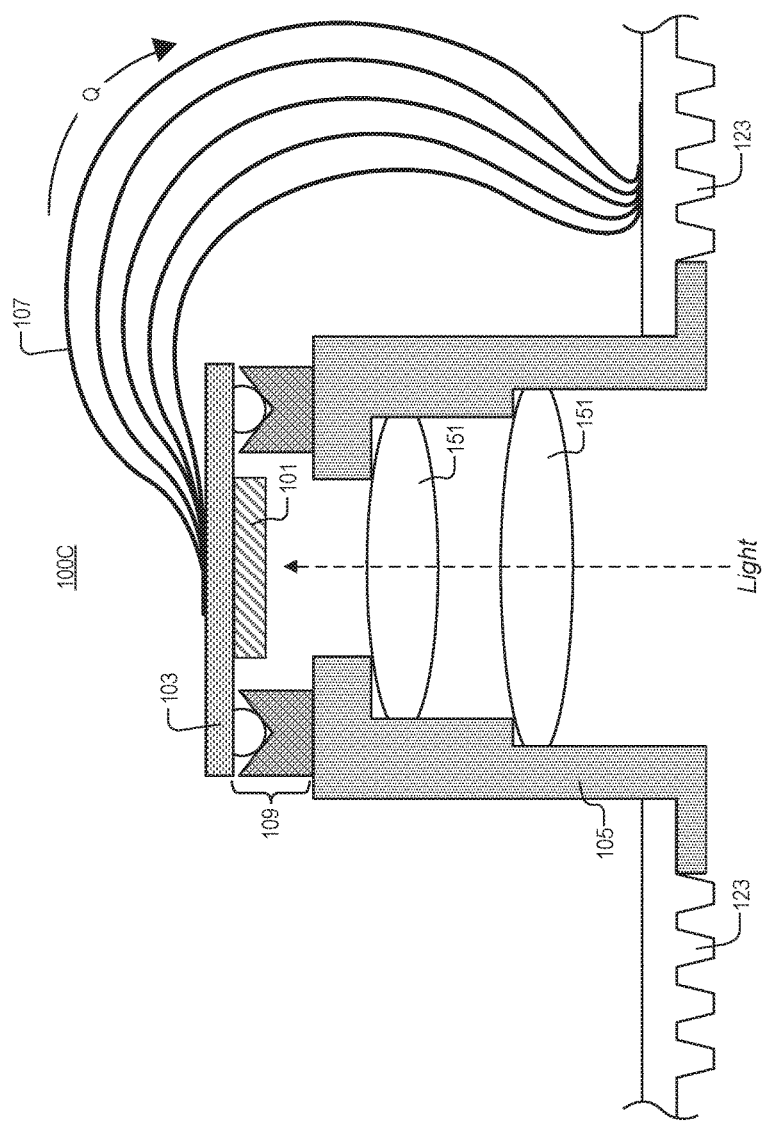
FIG. 1C illustrates a cross section of a camera system, in accordance with an embodiment of the disclosure.

FIG. 1C illustrates a cross section of camera system 100C, in accordance with an embodiment of the disclosure. Camera system 100C is similar in many respects to camera system 100A; however, in camera system 100C individual layers in the plurality of layers of thermal strap 107 are separated by air, vacuum, or flexible adhesive (see e.g., FIG. 1B adhesive 108). The separation of thermal strap 107 into multiple layers not mechanically connected—except at the beginning (e.g., 121) and end (e.g., 131) of thermal strap 107—provides increased flexibility, and thus reduces transfer of mechanical or thermal stresses (compared to a strap comprised of a single layer with equivalent heat transfer capability). It is important to note that the thermal strap may include fine wires, a braid, a series of cables, parallel ribbons or the like. Moreover, the heat sink coupled to the second end of thermal strap 107 is an external finned structure 123 that is connected to an end of lens barrel 105. In some embodiments, finned structure 123 may be inside the camera system 100C or may be located on the outside of the camera system 100C. The dedicated heat sink may be useful in situations where image sensor 101 produces enough heat so that the heat cannot be efficiently dissipated into lens barrel 105. In the depicted embodiment, thermal strap 107 is attached to circuit board assembly 103, and circuit board assembly 103 is located between a first end of the thermal strap 107 and the image sensor 101. However, in other embodiments, the first end of thermal strap 107 may be coupled either directly to image sensor 101 or to other locations on circuit board assembly 103. For instance, in some embodiments the first end of thermal strap 107 may be coupled to a lateral edge of circuit board assembly 103. Alternatively, additional components may be located between the first end of thermal strap 107 and circuit board assembly 103/image sensor 101. For example, thermal adhesive (see e.g., FIG. 1B adhesive 108) or the like could be located between the first end of thermal strap 107 and circuit board assembly 103.

Figure 2:
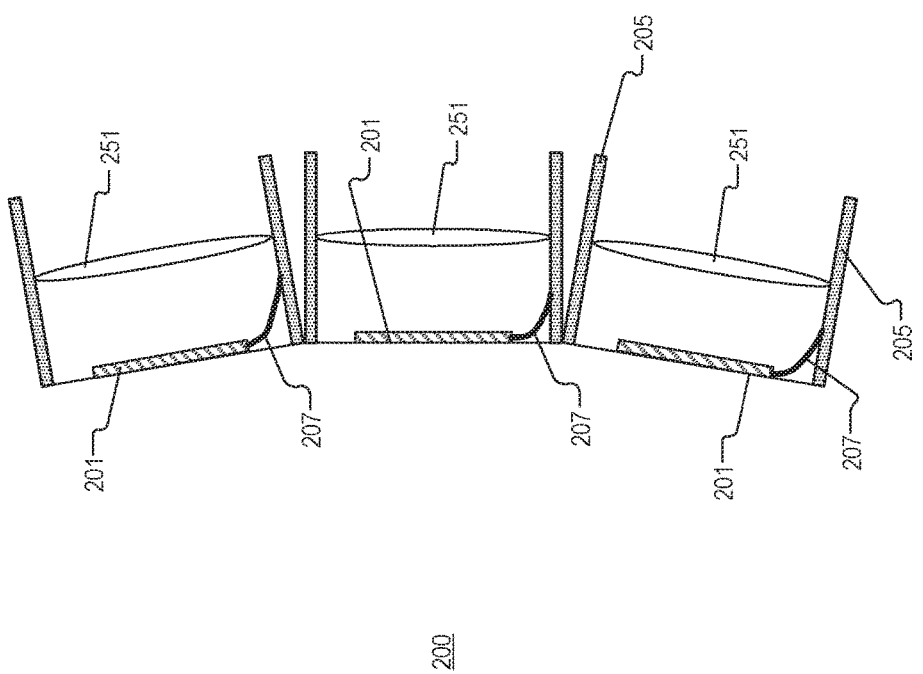
FIG. 2 illustrates a plurality of image sensors arranged into an array coupled to several thermal straps, in accordance with an embodiment of the disclosure.

FIG. 2 illustrates a plurality of image sensors 201 arranged into an array 200 coupled to several thermal straps 207, in accordance with an embodiment of the disclosure. As shown, lens optics 251 are positioned in front of image sensors 201 to receive and focus light, while thermal straps 207 are coupled to image sensors 201 to transfer heat from image sensors 201 into lens barrels 205. Thermal straps 207 may be directly attached to image sensors 201 or PCBAs. Thus, thermal straps 207 cross the active alignment plane without imparting mechanical stress to the image sensors 201.

Figure 3:
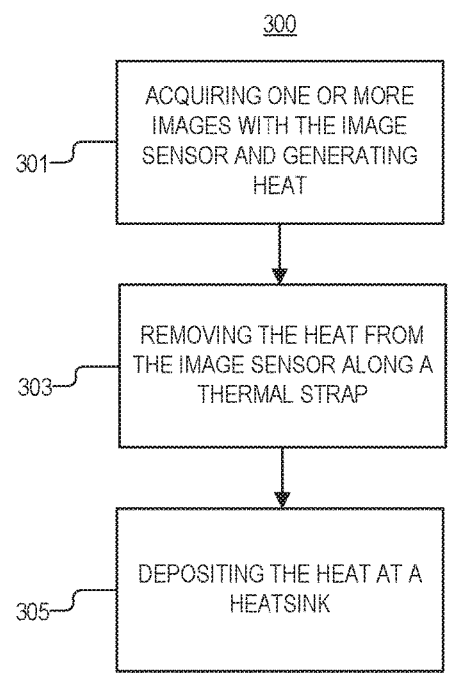
FIG. 3 illustrates a method of image sensor cooling, in accordance with an embodiment of the disclosure.

FIG. 3 is an illustration of a method 300 of image sensor cooling, in accordance with an embodiment of the disclosure. The order in which some or all of process blocks 301-305 appear in method 300 should not be deemed limiting. Rather, one of ordinary skill in the art having the benefit of the present disclosure will understand that some of method 300 may be executed in a variety of orders not illustrated, or even in parallel. Additionally, method 300 may include additional blocks or have fewer blocks than shown, in accordance with the teachings of the present disclosure.

Block 301 illustrates acquiring one or more images with the image sensor and generating heat in the image sensor (CCD, CMOS, or the like) as a byproduct of operation of the image sensor. In one embodiment, heat is received from the image sensor with a circuit board assembly mounted to the image sensor. The first end of a thermal strap may be coupled the circuit board assembly to remove the heat from the image sensor.

Block 303 depicts removing the heat from the image sensor along the thermal strap. As described above the thermal strap may include a plurality of layers, and the heat from the image sensor is received by a first end of the thermal strap and is transferred along a length of the plurality of layers. In one embodiment, the thermal strap is flexible to prevent stresses/strains from being imparted to the image sensor and the packaging holding the image sensor. This keeps the various image sensor and other mechanical and optical components aligned despite thermal expansion/contraction.

Block 305 shows depositing the heat at a heatsink thermally coupled to a second end of the thermal strap (opposite the first end of the thermal strap). In one embodiment depositing the heat at the heatsink includes depositing the heat in a lens barrel located near the image sensor. The second end of the thermal strap may be coupled to a side of the lens barrel. By depositing heat in the lens barrel, the thermal strap maintains the temperature of the image sensor and circuit board assembly within specified performance limits, and maintains optical performance of the camera system by preventing mechanical and thermal stresses from influencing the alignment between the sensor and its optics. The heat gradient between the center of the image sensor and the rest of the camera system may be drastically reduced. In one embodiment, multiple thermal straps may be coupled to the same image sensor/circuit board assembly to remove heat from the image sensor in a more evenly distributed manner. For example, two thermal straps may be coupled to remove heat from the image sensor on opposite sides of the image sensor/circuit board assembly.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A heat transfer apparatus, comprising:
    a circuit board assembly;
    an image sensor including a plurality of photodetectors disposed in a semiconductor material, wherein the image sensor is mounted to the circuit board assembly;
    a thermal strap with a first end that attaches to the circuit board assembly on an opposite side of the circuit board assembly as the image sensor, and that is thermally coupled to transfer heat out of the image sensor, wherein the thermal strap includes a plurality of layers, and wherein individual layers in the plurality of layers are separated by at least one of a vacuum, or a flexible thermal adhesive; and
    a lens barrel of a camera that, using a stepped pattern, is directly attached to, and that is thermally coupled to, a second end of the thermal strap opposite the first end of the thermal strap to receive heat from the image sensor.

2. The heat transfer apparatus of claim 1, wherein the thermal strap crosses an active alignment plane between the circuit board assembly and the lens barrel.

3. The heat transfer apparatus of claim 1, wherein the thermal strap is thermally coupled to the image sensor.

4. The heat transfer apparatus of claim 1, wherein the plurality of layers include at least one of copper or aluminum.

5. The heat transfer apparatus of claim 1, wherein the plurality of layers include graphitic carbon, and wherein at the first end of the thermal strap and at the second end of the thermal strap individual layers in the plurality of layers have an equal surface contact area between a heat source or a heat sink and each of the individual layers.

6. A camera system comprising:
    a lens barrel including lens optics;
    a circuit board assembly disposed proximate to the lens optics, wherein the lens optics include one or more lenses that are disposed between a source of image light and the circuit board assembly;
    an image sensor electrically and thermally coupled to the circuit board assembly and disposed between the lens optics and the circuit board assembly to receive image light from the lens optics; and
    a thermal strap including (i) a first end that attaches to the circuit board assembly on an opposite side of the circuit board assembly as the image sensor, and that is thermally coupled to transfer heat out of the image sensor, and (ii) a second end that, using a stepped pattern, is directly attached to, and that is thermally coupled to, the lens barrel, to receive heat from the image sensor.

7. The camera system of claim 6, wherein the thermal strap is attached to the image sensor.

8. The camera system of claim 6, wherein the thermal strap is attached to the circuit board assembly, and wherein the circuit board assembly is disposed between the first end of the thermal strap and the image sensor.

9. The camera system of claim 6, wherein the thermal strap includes at least one of a plurality of layers, wires, a braid, a series of cables, or ribbons.

10. The camera system of claim 9, wherein along a majority of the thermal strap the individual layers in the plurality of layers are separated by vacuum, or flexible thermal adhesive.

11. The camera system of claim 6, wherein the image sensor is included in a plurality of image sensors arranged into an array coupled to one or more thermal straps.

12. A method of image sensor cooling, comprising:

acquiring one or more images with an image sensor and generating heat in the image sensor as a byproduct of operation of the image sensor;

removing the heat from the image sensor along a thermal strap, and wherein the heat from the image sensor is received by a first end of the thermal strap that attaches to a circuit board assembly on an opposite side of the circuit board assembly as the image sensor, and that is thermally coupled to transfer heat out of the image sensor, and is transferred along a length of the thermal strap, and wherein the thermal strap is flexible, wherein the thermal strap includes a plurality of layers, and wherein individual layers in the plurality of layers are separated by at least one of a vacuum, or a flexible thermal adhesive; and depositing the heat at a lens barrel that, using a stepped pattern, is directly attached to, and that is thermally coupled to, a second end of the thermal strap that is opposite the first end of the thermal strap.

13. The method of claim 12, wherein removing the heat from the image sensor includes transferring heat through graphitic carbon.

14. The method of claim 12, wherein transferring the heat along the length of the thermal strap includes the thermal strap crossing an active alignment plane between the image sensor and the lens barrel.

15. The method of claim 12, wherein the thermal strap includes at least one of wires, a braid, a set of cables, or ribbons.

* * * * *